(12) United States Patent
Eberler et al.

(10) Patent No.: US 7,382,131 B2
(45) Date of Patent: Jun. 3, 2008

(54) GRADIENT COIL SYSTEM AND METHOD FOR THE PRODUCTION THEREOF

(75) Inventors: Michael Eberler, Postbauer (DE);
Thomas Kolbeck, Kalchreuth (DE);
Lothar Schön, Neunkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/586,895

(22) PCT Filed: Jan. 13, 2005

(86) PCT No.: PCT/EP2005/050130

§ 371 (c)(1),
(2), (4) Date: May 25, 2007

(87) PCT Pub. No.: WO2005/069029

PCT Pub. Date: Jul. 28, 2005

(65) Prior Publication Data

US 2007/0216411 A1    Sep. 20, 2007

(30) Foreign Application Priority Data

Jan. 20, 2004    (DE) .................... 10 2004 002 919

(51) Int. Cl.
*G01V 3/00* (2006.01)
(52) U.S. Cl. ...................... 324/318; 324/309
(58) Field of Classification Search ........ 324/300–322; 336/200; 428/323; 264/401
See application file for complete search history.

(56) References Cited

U.S. PATENT DOCUMENTS

| 4,684,406 | A | 8/1987 | Matsuura et al. |
|---|---|---|---|
| 5,730,925 | A | 3/1998 | Mattes et al. |
| 6,120,620 | A * | 9/2000 | Benz et al. .................. 148/302 |
| 6,376,148 | B1 * | 4/2002 | Liu et al. .................. 430/124.4 |
| 6,525,537 | B2 | 2/2003 | Nerreter |
| 6,780,368 | B2 * | 8/2004 | Liu et al. ..................... 264/401 |
| 6,933,825 | B2 * | 8/2005 | Nowak ....................... 336/200 |
| 7,047,098 | B2 | 5/2006 | Lindemann et al. |
| 7,241,415 | B2 * | 7/2007 | Khoshnevis .................... 419/6 |
| 2004/0094728 | A1 | 5/2004 | Herzog et al. |
| 2005/0142024 | A1 | 6/2005 | Herzog |
| 2006/0222844 | A1 * | 10/2006 | Stinson ....................... 428/323 |

FOREIGN PATENT DOCUMENTS

| DE | 195 19 933 | 12/1996 |
|---|---|---|
| DE | 197 22 211 | 8/1998 |
| DE | 199 05 067 | 8/2000 |
| DE | 100 42 132 | 3/2002 |
| EP | 1 148 341 | 10/2001 |

* cited by examiner

*Primary Examiner*—Brij Shrivastav
(74) *Attorney, Agent, or Firm*—Schiff Hardin LLP

(57) ABSTRACT

In a method for manufacturing a gradient coil system for a magnetic resonance apparatus, the conductor arrangement of the gradient coil system is produced by successively applying respective layers of metal powder sinter material on a workpiece platform, and successively sintering the respective layers by the application of radiation, such as laser radiation, to the individual layers, and the conductor arrangement is assembled with other components to produce the gradient coil system. A gradient coil system manufactured in accordance with this method includes a number of assembled components, including an electrical conductor arrangement, with the electrical conductor arrangement having conductors formed by radiation-sintered metal powder material.

11 Claims, 2 Drawing Sheets

GRADIENT COIL SYSTEM AND METHOD FOR THE PRODUCTION THEREOF

BACKGROUND OF THE INVENTION

1. Field of the Invention

The present invention concerns a gradient coil system and a method for the production of the gradient coil system.

2. Description of the Prior Art

Magnetic resonance technology is a known modality to, among other things, acquire images of the inside of a body of an examination subject. Rapidly-switched gradient fields that are generated by a gradient coil system are superimposed on a static basic magnetic field that is generated by a basic field magnet. The magnetic resonance apparatus also has a radio-frequency system that radiates radio-frequency signals into the examination subject to excite magnetic resonance signals and that acquires the excited magnetic resonance signals, on the basis of which magnetic resonance images are generated.

The gradient coil system is normally formed by multiple coil layers situated one atop the other. The individual coil layers exhibit a complex geometry, are wound in one plane, are mounted atop one another together with insulation layers and are subsequently cast with the gradient coil system under vacuum with a thermosetting casting resin based on epoxy resin. For dissipation of heat, additional layers of coolant tubes or coolant pipes are inserted through which a coolant medium (for example, coolant water) flows in operation. It is also known to introduce additional layers for shim coils into the gradient coil system. In the case of an essentially hollow-cylindrical gradient coil system, the planar finished coil segments are curved into the shape of a cylinder segment and introduced into the gradient coil system. Given the production method described in the preceding, it is particularly disadvantageous (with regard to the later assembly capability) that the individual coil layers are limited in terms of design to an essentially two-dimensional design. A higher production cost also arises for the assembly of approximately nine coil layers with insulation and reinforcement layers belonging thereto. Furthermore, the contacting between the individual coil layers with up to approximately 500 solder points per gradient coil system is very complicated.

An object of the invention is to provide a gradient coil system in which the aforementioned disadvantages are avoided.

The above object is achieved in accordance with the invention by a gradient coil system for a magnetic resonance apparatus at least one part of an electrical conductor arrangement of the gradient coil system is produced by the action of radiation (in particular laser radiation) on a metal powder sinter material.

Compared to the known methods, the following advantages are achieved. In a structural volume available for the gradient coil system, an arbitrary course of the electrical conductors can be selected without consideration of the technical production requirements, thereby allowing previous designs that were considered as unrealizable in terms of production technology to be realized simply. A three-dimensional design plan of the electrical conductor paths of the gradient coil system can be directly adopted for the production method. Each change of the path of the electrical conductors can be done without adaptation of the production means, so that (among other things) a time savings is achieved in the development phase. Contactings of individual conductors among one another are no longer necessary at all given the finished sintered conductor arrangement. The manual assembly effort is drastically reduced. Since no residual stresses arise (for example due to a curvature or coiling) that can cause deformations in the sealing process, a higher precision is achieved.

DESCRIPTION OF THE PREFERRED EMBODIMENTS

Figure 1:
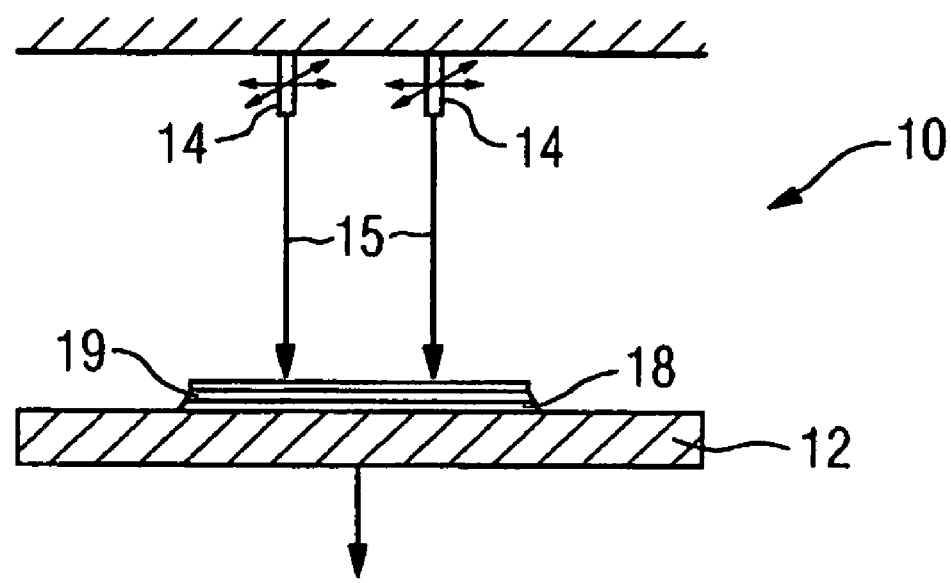
FIG. 1 schematically illustrates laser sintering of components of a gradient coil system in accordance with the inventive method.

At the beginning of a method for production of a conductor arrangement by laser sintering, a three-dimensional design plan of the desired course of the electrical conductors of the gradient coil system exists. This three-dimensional design plan is prepared for the laser sintering such that it is divided into parallel layers with a typical thickness of 50-100 μm. The design plan so prepared is passed to a laser sintering system 10 in which a powder layer 18 of a selected metal powder with high electrical conductivity (in particular copper powder or aluminum powder) is generated corresponding to the layer thickness on a workpiece platform 12 of the laser sintering system 10. This powder layer 18 represents a first layer of the design plan within which electrical conductors run. The laser sintering system 10 sinters or fuses the metal powder in the region of the electrical conductors using a laser beam 15 of high energy. By variation of the process parameters it is intended to fuse the metal powder optimally without pores in order to achieve the properties of the solid material to the greatest possible extent. The workpiece platform 12 is subsequently lowered by one layer thickness and a second powder layer 19 (corresponding to the layer thickness) is applied and also sintered with the laser beam 15 as described in the preceding. Sintered sub-regions situated atop one another are thereby connected. The application of a metal powder layer, the sintering with the laser beam 15 and the lowering of the construction platform 12 are repeated until all layers of the design plan are finished. At the end of the aforementioned production cycle, the generated conductor arrangement is completely surrounded by metal powder and the finished conductor arrangement is extracted from the surrounding metal powder. More detail regarding methods and devices for laser sintering is, for example, described in DE 195 14 740 C1, DE 100 53 742 A1, EP 1 234 625 A1 etc.

Figure 2:
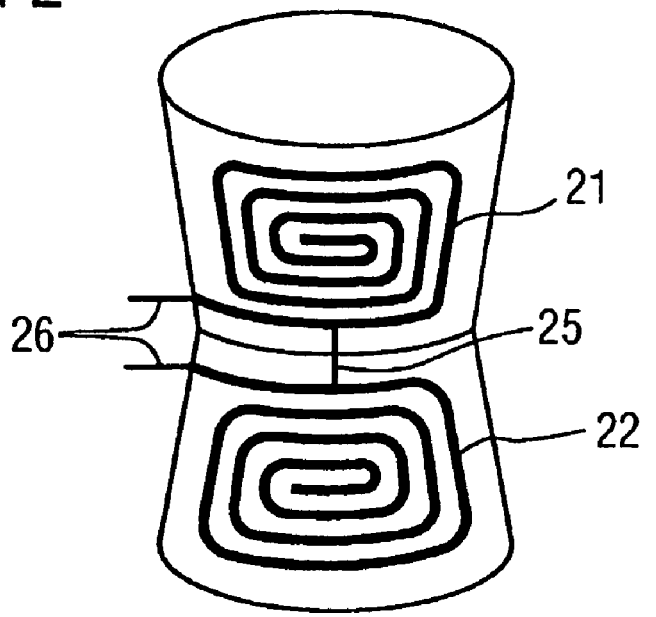
FIG. 2 illustrates the assembly of sub-coils and an insulation layer with coolant tubes therein of a gradient coil system, together with a casting mold for the gradient coil system, in accordance with the inventive method.
Figure 2:
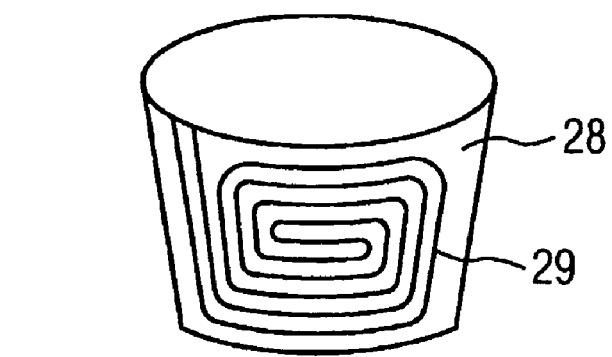
Figure 2:
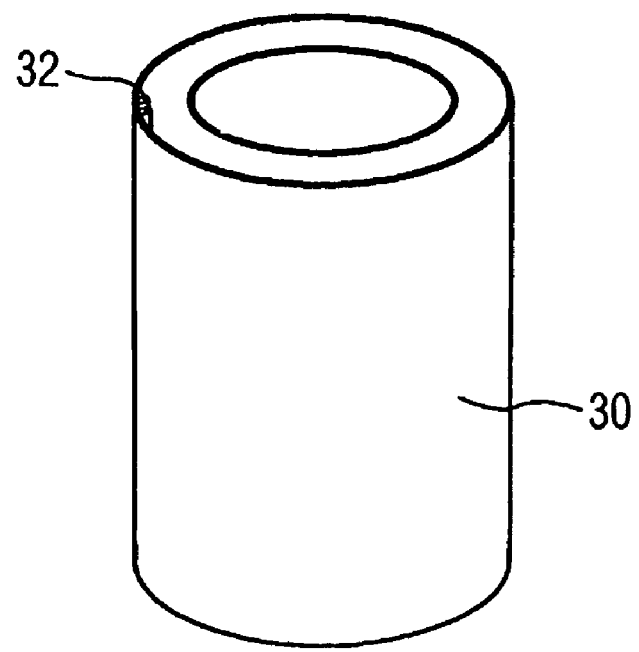

FIG. 2 as an example shows two sub-coils 21 and 22 arranged on frustum-like surfaces of a transversal gradient coil of a gradient coil system that has been generated by laser sintering in that, according to the method described in the preceding, the frustums are partitioned into slice-like layers and the design plan forming the basis of the sub-coils has been finished layer-by-layer.

For a short production time, in one embodiment the laser sintering system 10 is equipped with a number of lasers 14 that expose simultaneously. Exposure strategies are used that effect an optimally high material density, i.e. that locally melt the metal powder completely. Furthermore, exposure strategies are used that prevent distortion appearances.

If a number of individual coils of the conductor arrangement that are free of an electrical connection within the gradient coil system are simultaneously generated with the method described in the preceding, to prevent the basic problem that the individual coils could mutually shift given the extraction from the metal powder, webs are additionally sintered in the production method, the webs connecting the individual coils with one another and being easily removable after the extraction from the metal powder due to predetermined break points that are provided within the webs. A web 25 is exemplarily shown between the sub-coils in FIG. 2.

In one embodiment, fixing and/or adjustment elements 26 are additionally sintered that allow an automatic adjustment of the sintered structure given usage in a casting mold 30 with corresponding counterparts 32.

The conductor arrangement extracted from the metal powder is further processed as follows. Planar insulation layers are inserted between individual coils of the conductor structure. Coolant elements arranged in a serpentine shape on a carrier plate are inserted between the individual coils. In this regard FIG. 2 exemplarily shows one of the insulation layers 28 together with a coolant tube 29 arranged thereupon for the sub-coil 21. The conductor arrangement, including the insulation layer and cooling elements, is inserted into the casting mold 30. An electrical insulation and mechanical fixing is achieved by a casting of the free spaces remaining between the conductor arrangement with a casting resin advantageously containing filler material and subsequent hardening. The casting with a casting resin based on epoxy resin preferably ensues under vacuum and if applicable with subsequent pressurization.

Figure 3:
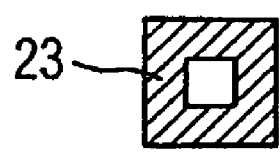
FIG. 3 is a cross-section of a hollow conductor used in a conductor arrangement in the gradient coil system in accordance with the inventive method.

In an embodiment, at least parts of the electrical conductor arrangement according to FIG. 3 are generated as hollow conductors so that the hollow conductor 23 can be directly cooled with a coolant flowing through it and, if applicable, additional cooling elements in the gradient coil system can be omitted.

Although modifications and changes may be suggested by those skilled in the art, it is the invention of the inventors to embody within the patent warranted heron all changes and modifications as reasonably and properly come within the scope of their contribution to the art.

The invention claimed is:

1. A coil system for a magnetic resonance apparatus, comprising:
   a gradient coil system comprising a plurality of assembled components including a gradient coil electrical conductor arrangement; and
   said gradient coil electrical conductor arrangement including gradient coil conductors comprised of radiation-sintered metal powder material.

2. A coil system as claimed in claim 1 wherein said metal powder material is selected from the group consisting of copper powder and aluminum powder.

3. A coil system as claimed in claim 1 wherein said plurality of components also includes insulation and cooling devices, and wherein said gradient coil conductor arrangement is cast with epoxy resin with at least one other component in said plurality of components.

4. A coil system as claimed in claim 1 wherein said gradient coil conductor arrangement comprises hollow gradient coil conductors for conveyance of a coolant medium therethrough.

5. A method for manufacturing a gradient coil system for a magnetic resonance apparatus, said gradient coil system comprising a plurality of components including a gradient coil conductor arrangement, comprising the steps of:
   producing said gradient coil conductor arrangement by successively applying respective layers of metal powder sinter material on a workpiece platform and successively sintering the respective layers by application of radiation to the individual layers in succession; and
   assembling said gradient coil conductor arrangement with other components in said plurality of components to produce said gradient coil system.

6. A method as claimed in claim 5 comprising sintering said metal powder sinter material with laser radiation.

7. A method as claimed in claim 5 comprising generating a three-dimensional design plan for said gradient coil conductor arrangement and dividing said three-dimensional design plan into gradient coil conductor paths respectively disposed in said layers.

8. A method as claimed in claim 5 comprising additionally generating, by said sintering, at least one removable web between respective portions of said gradient coil conductor arrangement.

9. A method as claimed in claim 5 wherein the step of assembling said components to form said gradient coil system comprises casting said plurality of components in a casting mold, and comprising sintering at least one adjustment element, when sintering said conductor arrangement, that automatically adjusts said gradient coil conductor arrangement in said casting mold.

10. A method as claimed in claim 5 wherein one of said plurality of components is insulation, and wherein the step of assembling said components comprises casting said gradient coil conductor arrangement together with said insulation in a casting mold.

11. A method as claimed in claim 5 wherein one of said plurality of components is cooling device, and wherein the step of assembling said components comprises casting said gradient coil conductor arrangement together with said cooling device in a casting mold.

* * * * *